United States Patent
Imai

(10) Patent No.: US 6,194,261 B1
(45) Date of Patent: Feb. 27, 2001

(54) HIGH YIELD SEMICONDUCTOR DEVICE AND METHOD OF FABRICATING THE SAME

(75) Inventor: Kiyotaka Imai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/255,695

(22) Filed: Feb. 23, 1999

Related U.S. Application Data

(62) Division of application No. 09/188,378, filed on Nov. 10, 1998, now Pat. No. 6,031,271.

(30) Foreign Application Priority Data

Nov. 13, 1997 (JP) .................................................. 9-311851

(51) Int. Cl.⁷ ............................................... H01L 21/8234
(52) U.S. Cl. ......................... 438/238; 438/586; 438/639
(58) Field of Search .................................... 438/233, 238, 438/381, 382, 586, 597, 639, 655

(56) References Cited

U.S. PATENT DOCUMENTS

| | | | |
|---|---|---|---|
| 5,030,584 | * 7/1991 | Nakata | 438/586 |
| 5,600,170 | 2/1997 | Sugiyama et al. | 257/393 |
| 5,705,437 | * 1/1998 | Wu et al. | 438/238 |
| 5,824,579 | * 10/1998 | Subramanian et al. | 438/238 |

FOREIGN PATENT DOCUMENTS 0 587 399    3/1994  (EP) .

* cited by examiner

*Primary Examiner*—Chandra Chaudhari
(74) *Attorney, Agent, or Firm*—Young & Thompson

(57) ABSTRACT

A unit cell of a static random-access memory includes a laminated gate electrode structure adjacent to a diffusion layer. A top surface of the gate electrode structure is coated with a first silicide layer and the diffusion layer includes a second silicide layer. The second silicide layer is separated from the gate electrode structure by a distance that is the same as a width of a sidewall spacer on an opposite side of the gate electrode structure. The portion of the diffusion layer that is exposed between the second silicide layer and the gate electrode structure has a higher impurity concentration than the remainder of the diffusion layer to reduce or eliminate undesired leakage voltage.

6 Claims, 4 Drawing Sheets

HOLE CENTER

HIGH YIELD SEMICONDUCTOR DEVICE AND METHOD OF FABRICATING THE SAME

CROSS-REFERENCE TO RELATED APPLICATIONS

This application is a division of application Ser. No. 09/188,378, now U.S. Pat. No. 6,031,271, filed Nov. 10, 1998.

BACKGROUND OF THE INVENTION

1. Field of the Invention

The present invention relates generally to semiconductors, and more particularly to a semiconductor device and a method of fabricating the same so that the yield of such semiconductor devices is improved.

2. Description of the Related Art

In known semiconductor devices where a laminated structure of an insulating layer and a conductive layer is formed on a first semiconductor body, spacers are provided on sidewalls of the laminated structure and a diffusion layer is then formed in the first semiconductor body so that one edge of the diffusion layer is adjacent to one of the spacers. A second semiconductor body is formed and a shared contact hole is then created in the second semiconductor body for establishing an ohmic contact between the diffusion layer and the conductive layer. It is the usual practice to position the shared contact hole so that its vertical center axis is aligned with the edge of the conductive layer.

However, the yield of the prior art semiconductor devices is low due to device failures revealed at the inspection stage of manufacture.

SUMMARY OF THE INVENTION

It is therefore an object of the present invention to increase the yield of semiconductor devices.

The present invention is based on a discovery that the hole contact resistance that varies as a function of distance from the center axis of the hole is asymmetric with respect to that axis.

According to a first aspect of the present invention, there is provided a semiconductor device comprising a first semiconductor body, a diffusion layer in the first semiconductor body, a laminated structure of an insulating layer on the first semiconductor body adjacent to the diffusion layer and a conductive layer on the insulating layer, an insulating spacer on a sidewall of the laminated structure, the spacer having a width W, and a second semiconductor body having a shared contact hole for establishing an ohmic contact between the diffusion layer and the conductive layer, the shared contact hole having a center axis located a distance W/2 from an edge of the conductive layer so that portions of the diffusion layer and the conductive layer which are exposed to the outside through the shared contact hole have substantially equal areas.

According to a second aspect, the present invention provides a semiconductor device comprising a first semiconductor body, a diffusion layer in the first semiconductor body, a laminated structure of an insulating layer on the first semiconductor body adjacent to the diffusion layer, a polysilicon layer on the insulating layer and a first silicide layer on the polysilicon layer, an insulating spacer on a sidewall of the laminated structure, a second silicide layer in the diffusion layer, the second silicide layer having an edge spaced from an edge of the laminated structure by an amount equal to a width of the spacer, and a second semiconductor body having a shared contact hole for establishing an ohmic contact between the first and second silicide layers, the shared contact hole having a center axis located at equal distances from the edges of the first and second silicide layers so that portions of the first and second silicide layers which are exposed to the outside through the shared contact hole have substantially equal areas.

According to a third aspect, the present invention provides a method for fabricating a semiconductor device, comprising the steps of forming a first semiconductor body, forming a laminated structure of an insulating layer on the first semiconductor body and a conductive layer on the insulating layer, forming insulating spacers on sidewalls of the laminated structure, each of the spacers having a width W, forming a diffusion layer in the first semiconductor body so that an edge of the diffusion layer is adjacent to one of the spacers, forming a second semiconductor body, and forming a shared contact hole in second semiconductor body for establishing an ohmic contact between diffusion layer and conductive layer, a center axis of the shared contact hole being located a distance W/2 from an edge of laminated structure so that portions of diffusion layer and conductive layer which are exposed to the outside through shared contact hole have substantially equal areas.

According to a fourth aspect, the present invention provides a method for fabricating a semiconductor device, comprising the steps of forming a first semiconductor body, forming a laminated structure of an insulating layer on the first semiconductor body, a polysilicon layer on the insulating layer and a first silicide layer on the polysilicon layer, forming insulating spacers on sidewalls of the laminated structure, forming a diffusion layer in the first semiconductor body so that an edge of the diffusion layer is adjacent to one of the spacers, forming a second silicide layer in the diffusion layer so that an edge of the second silicide layer is adjacent to one of the spacers, forming a second semiconductor body, and forming a shared contact hole in the second semiconductor body for establishing an ohmic contact between the first and second silicide layers, a center axis of the shared contact hole being located at equal distances from the edges of the first and second silicide layers so that portions of the diffusion layer and the conductive layer which are exposed to the outside through the shared contact hole have substantially equal areas.

BRIEF DESCRIPTION OF THE DRAWINGS

The present invention will be described in further detail with reference to the accompanying drawings, in which.

DETAILED DESCRIPTION

Before proceeding with the detailed description of the present invention, it may prove helpful to provide an explanation of the prior art problem using a static RAM as a typical example with reference to FIGS. 1 to 4.

Figure 1:
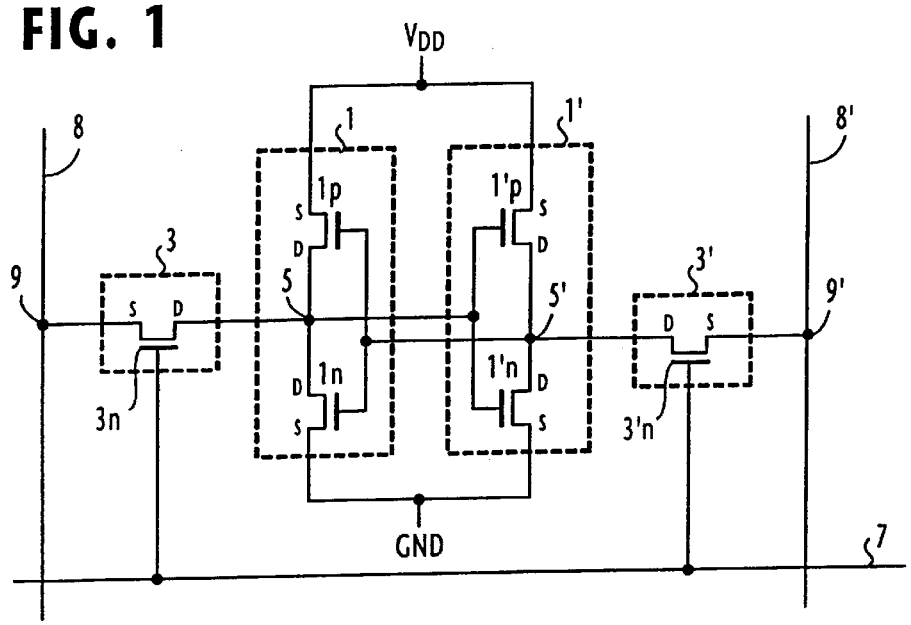
FIG. 1 is a circuit diagram of a unit cell of a conventional static random-access memory.

As shown in FIG. 1, a 6-transistor unit cell of the conventional static RAM is made up of a pair of driver gates 1 and 1' and a pair of transfer gates 3 and 3'. Each of the driver gates 1 and 1' consists of a PMOS transistor "p" and an NMOS transistor "n". The gate electrodes of driver-gate transistors $1p$ and $1n$ are connected together and cross-coupled to a circuit node, or shared contact 5' where the drains of the driver-gate transistors $1'p$ and $1'n$ are connected, and the gate electrodes of driver-gate transistors $1'p$ and $1'n$ are connected together and cross-coupled to a circuit node, or shared contact 5 where the drains of the driver-gate transistors $1p$ and $1n$ are connected. The sources of both driver-gate PMOS transistors $1p$ and $1'p$ are connected to a voltage supply $V_{DD}$ and the sources of both driver-gate NMOS transistors $1n$ and $1'n$ are connected to ground. Each of the transfer gates 3 and 3' is made up of an NMOS transistor whose gate is connected to a word line 7. The transfer-gate NMOS transistor $3n$ has its source connected to a bit line 8 at a circuit node 9 and its drain connected to the circuit node 5, and the transfer-gate NMOS transistor $3'n$ has its source connected to a bit line 8' at a circuit node 9' and its drain to the shared contact 5'.

Figure 2:
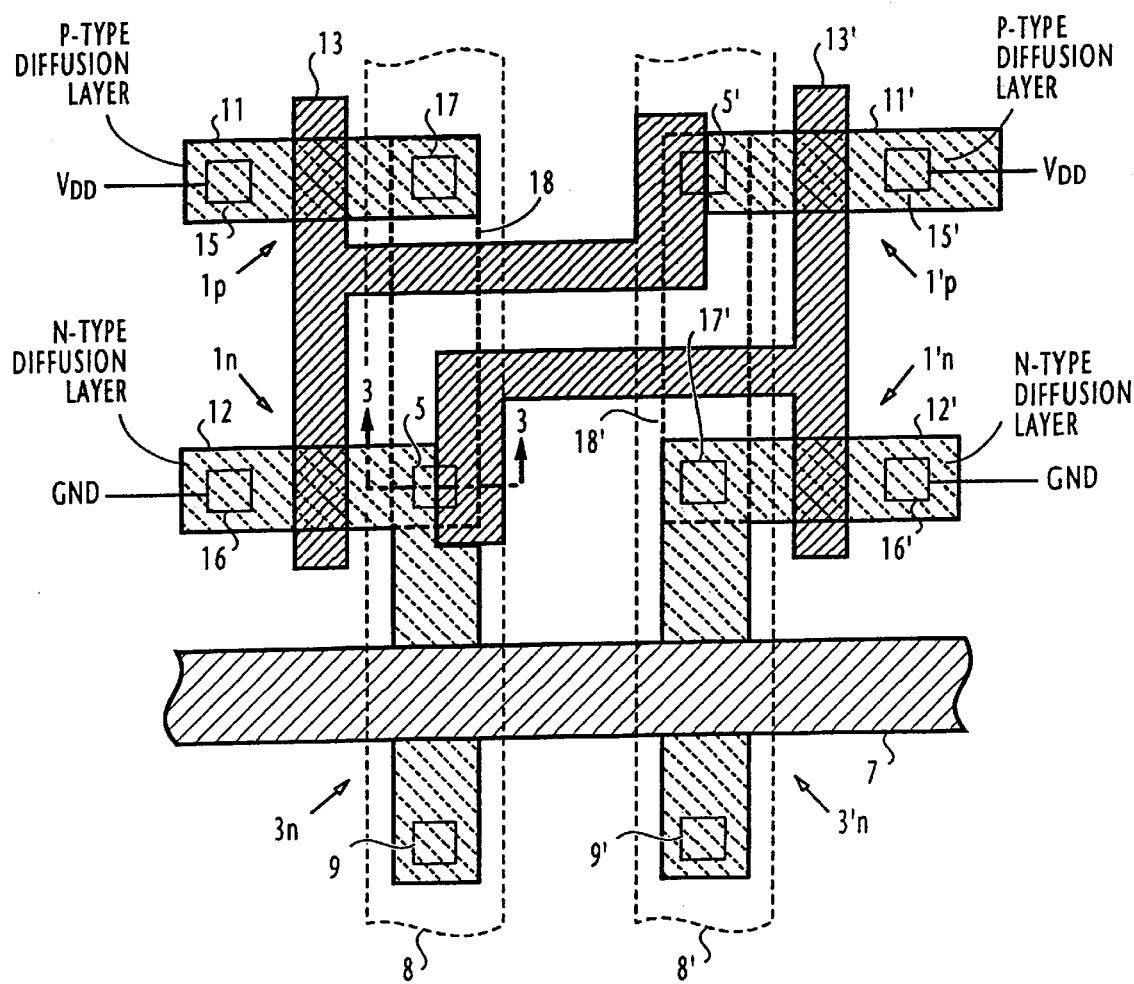
FIG. 2 is a layout view of the unit cell of FIG. 1.

The layout of the unit memory cell is illustrated in FIG. 2. In the driver gate 1, the PMOS transistor $1p$ is formed by a p-type diffusion layer 11, with the source region of transistor $1p$ being connected through a contact 15 to the voltage source $V_{DD}$ and the drain region being connected through a contact 17 to a metallic layer 18. The NMOS transistor $1n$ is formed by the horizontally extending portion of an inverted-L shaped n-type diffusion layer 12. The source region of transistor $1n$ is connected through a contact 16 to ground and its drain region is connected to the metallic layer 18 through a contact which forms the circuit node 5 of FIG. 1. The channel regions of transistors $1p$ and $1n$ are both connected to a polysilicon gate 13.

The layout of driver gate 1' is similar to that of driver gate 1. The PMOS transistor $1'p$ is formed by a p-type diffusion layer 11', with the source region of transistor $1'p$ being connected through a contact 15' to the voltage source $V_{DD}$ and the drain region being connected through a contact 17' to a metallic layer 18'. The NMOS transistor $1'n$ is formed by the horizontally extending portion of an inverted-L shaped n-type diffusion layer 12'. The source region of transistor $1'n$ is connected through a contact 16' to ground and its drain region is connected through the shared contact 5'. The channel regions of transistors $1'p$ and $1'n$ are both connected to a polysilicon gate 13'.

Polysilicon gate 13, to which the drains of transistors $1p$ and $1n$ are connected together, is so shaped that it extends horizontally into the region of the other driver gate 1' and connects to the shared contact 5'. Similarly, the polysilicon gate 13', to which the drains of transistors $1'p$ and $1'n$ are connected together, has a horizontal extension which connects to the shared contact 5.

NMOS transfer-gate transistor $3n$ is formed by the vertically extending portion of the n-type diffusion layer 12, with the source region of transistor $3n$ being connected to word line 7 through a contact 9 and the drain region being connected to the shared contact 5 as well as to contact 17. NMOS transfer-gate transistor $3'n$ is similarly formed by the vertically extending portion of the n-type diffusion layer 12', with the source region of transistor $3'n$ being connected to word line 7 through a contact 9'. The drain region of this transistor $3'n$ is connected to the contact 17' as well as to the shared contact 5'.

Figure 3A:
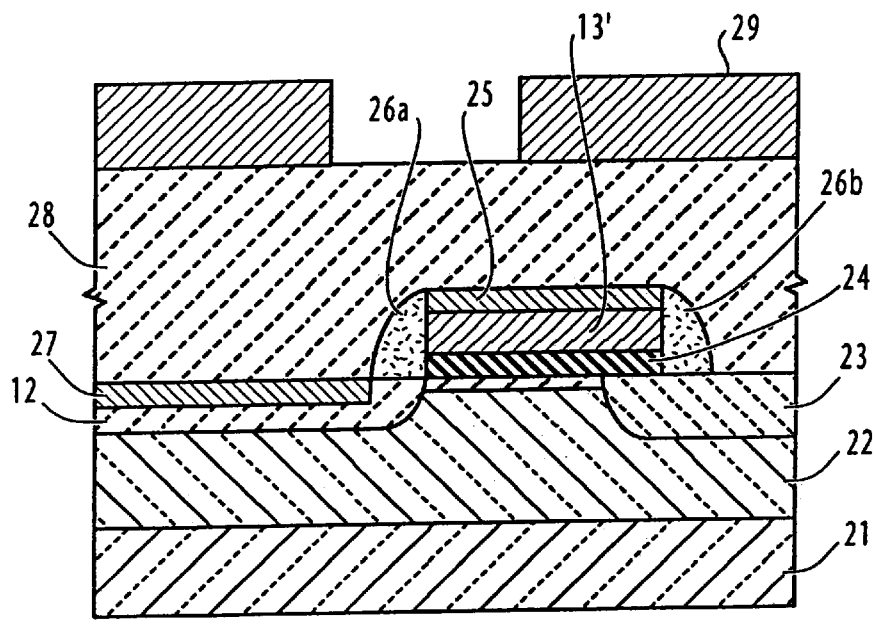
FIGS. 3A and 3B are cross-sectional views of a portion of the unit cell taken along the lines 3—3 of FIG. 1 for illustrating successive processes of forming that portion of the cell.
Figure 3B:
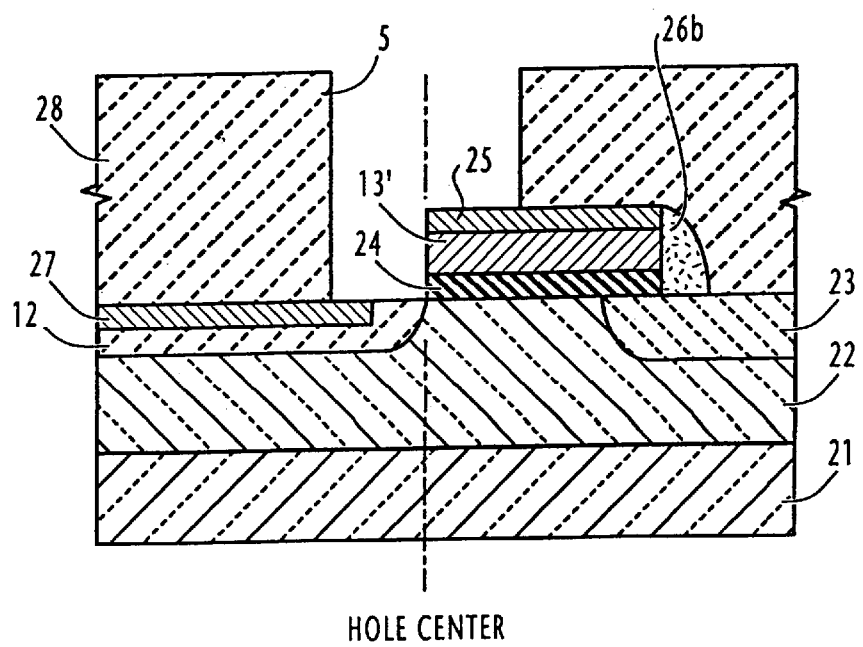

A vertical cross-section of a portion of the unit cell that encompasses the shared contact 5 is formed in successive stages as illustrated in FIGS. 3A and 3B. As shown in FIG. 3A, the cross-sectioned portion has a p-type well 22 formed on a p-type silicon substrate 21. The p-type well 22 is ion-injected to form the n-type diffusion layer 12 and the local oxidation technique is used to form a channel stopper 23 in the well 22. A silicon-dioxide layer 24 is then formed on the p-type well 22 so that it covers an area of the well 22 extending from the edge of the n-type diffusion layer 12 to a point beyond the edge of channel stopper 23. A portion of the polysilicon gate 13' is formed on the silicon-dioxide layer 24.

In order to reduce the sheet resistance of the memory cell, the surface of the polysilicon gate 13' and the n-type diffusion layer are coated with a silicide layer. Polysilicon gate 13' is first coated with a silicide layer 25 and insulating sidewall spacers 26a and 26b are deposited on sidewalls of the laminated structure of the layers 24, 13' and 25. A silicide layer 27 is then deposited on the n-type diffusion layer 12 as well as on the p-type diffusion layer 11. Sidewall spacers 26a and 26b electrically isolate the silicide layer of all regions of the diffusion layers from polysilicon gate 13'.

The memory cell is then coated with an interlayer film 28 and a photoresist 29 is provided to expose a portion of the interlayer film 25. The memory cell is then subjected to radiation through the photoresist 29 and then etched to form a shared contact hole for the shared contact 5 as shown in FIG. 3B. With this etching process, the sidewall spacer 26a is also removed, leaving a portion of the n-type diffusion layer 12, as well as portions of the silicide layers 25, 27, to be exposed to the outside through the hole of shared contact 5. Hole of the shared contact 5 is then filled with conductive material so that the drain region of the n-type diffusion layer 12 is brought into ohmic contact with the polysilicon gate 13'.

It is the usual practice that the photoresist 29 is positioned so that the center axis of the shared contact hole 5 is aligned with the edge of the silicide layer 25. Since the semiconductor structure around the shared contact 5' is identical to that of the shared contact 5, the description is only limited to the structure around the shared contact 5. Since the areas of the silicide layers 25 and 27 that are exposed within the shared contact hole 5 are not equal to each other, the resistance of the shared contact 5 exhibits a significantly asymmetric characteristic.

Figure 4:
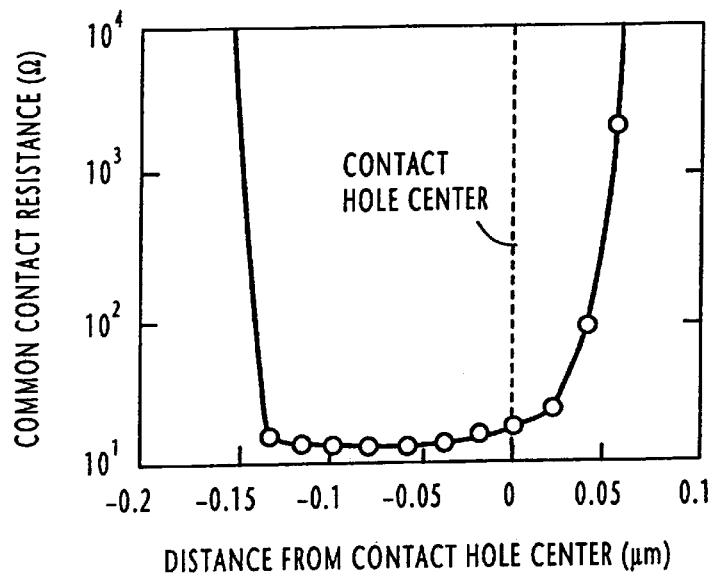
FIG. 4 is a graphic representation of the shared contact resistance plotted as a function of off-center displacement of the contact hole of the prior art unit cell from the intended reference point.

As shown in a resistance curve of FIG. 4 which is plotted as a function of off-center displacement and in which the intended hole center is located at a reference point 0 on the horizontal axis of the graph, a 0.05-$\mu$m displacement of the contact hole 5 to the right from the reference point 0 shows a marked increase in resistance, while an almost steady state is maintained until the hole 5 is displaced a distance of 0.14 micrometers to the left from the reference point.

Due to the inherent manufacturing tolerances, this asymmetric contact resistance characteristic is a cause of device failures, and hence low yield.

In addition, it is found that the surface portion of diffusion layer 12 where the sidewall spacer 26a was existent is depleted of the necessary impurities and is tended to be physically worn out due to the absence of the silicide layer 27. As a result, the memory cell produces an undesired leakage current.

Figure 5:
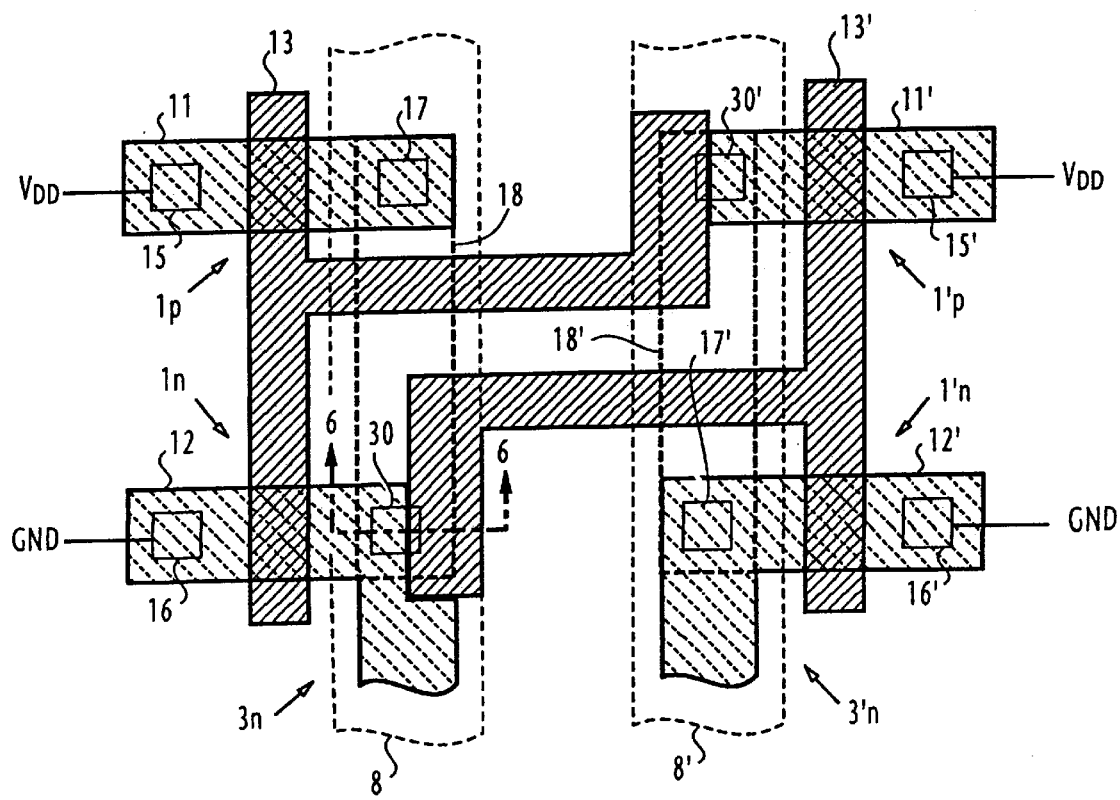
FIG. 5 is a layout view of the unit cell according to the present invention.

FIG. 5 is a diagram showing the layout of a static RAM unit cell according to the present invention. In FIG. 5, parts corresponding in significance to those in FIG. 2 are marked with the same numerals as those used in FIG. 2. In the present invention, contacts 30 and 30' are provided corresponding to the shared contacts 5 and 5' of the prior art. Shared contacts 30 and 30' are positioned slightly away from the polysilicon gates 13' and 13, respectively.

Figure 6:
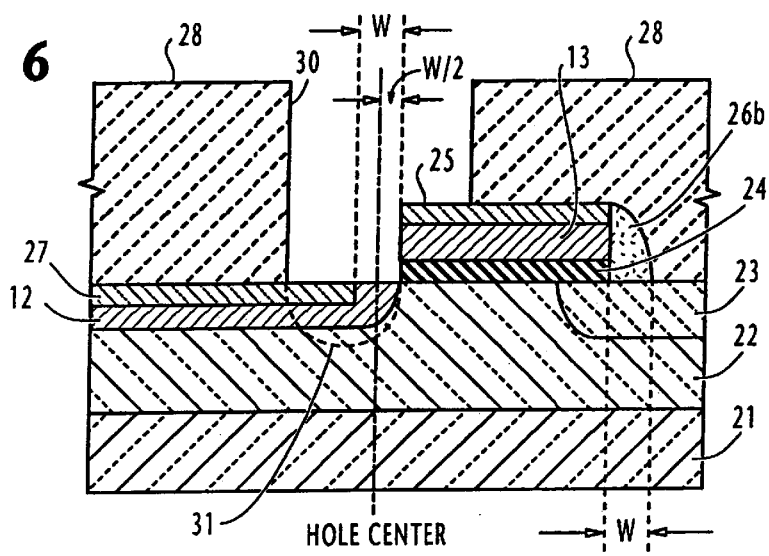
FIG. 6 is a cross-sectional view taken along the lines 6—6 of FIG. 5.

FIG. 6 shows the structure around the shared contact 30 in detail. It is seen that the shared contact hole 30 is positioned so that its center is located a distance W/2 from the edge of the silicide layer 25, where W is the width of each of the sidewall spacers 26a and 26b. Note that this width is equal to the width of the removed sidewall spacer 26a, and hence to the spacing between the edges of silicide layers 25 and 27. Therefore, it is intended in the present invention that the center of the contact hole 30 be located at equal distances from the edges of the two silicide layers. The areas of the silicide layers 25 and 27 which are exposed to the outside through the shared contact hole 30 are of the same size.

Figure 7:
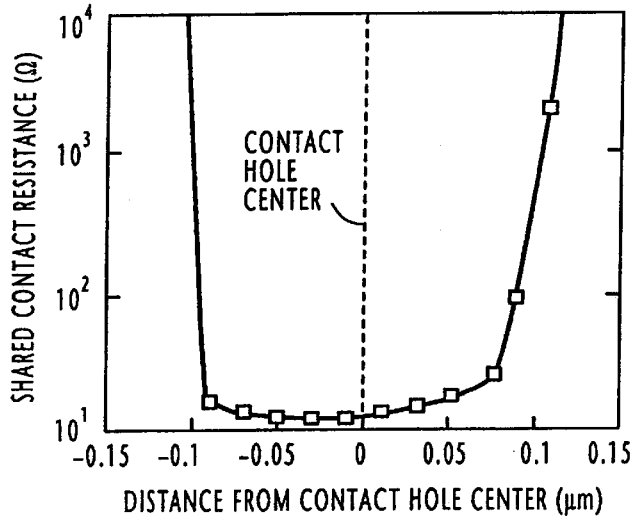
FIG. 7 is a graphic representation of the shared contact resistance plotted as a function of off-center displacement of the contact hole of the unit cell of the present invention from the intended reference point.

A resistance curve of the unit cell of FIG. 5 is plotted as a function of off-center displacement as shown in FIG. 7. The intended hole center (i.e., W/2 from both edges of the silicide layers 25 and 27) is indicated as reference point 0 on the horizontal axis of the graph. It is seen that off-center displacement of the shared contact hole 30 shows a substantially symmetric ohmic relationship with respect to the reference point over distances of 0.09 micrometers. Thus, the positioning of shared contact hole 30 can be tolerated in a range of ±0.09 micrometers.

In a preferred embodiment, it is useful to inject n-type impurity such as phosphorus is doped into the exposed area of the shared contact hole 30 at an energy level of 30 to 70 keV with a dose of $5 \times 10^{14}$ cm$^{-2}$ to $5 \times 10^{15}$ cm$^{-2}$. This impurity doping results in the creation of an n-type diffusion region 31 which, in effect, increases the impurity concentration of the area n-type diffusion layer 12 which is not covered by the silicide layer 27. The undesired leakage current is eliminated in this way. As a result, the resistance at the shared contacts 30 and 30' is reduced, making possible high speed read/write operation of the static RAM.

Figure 8:
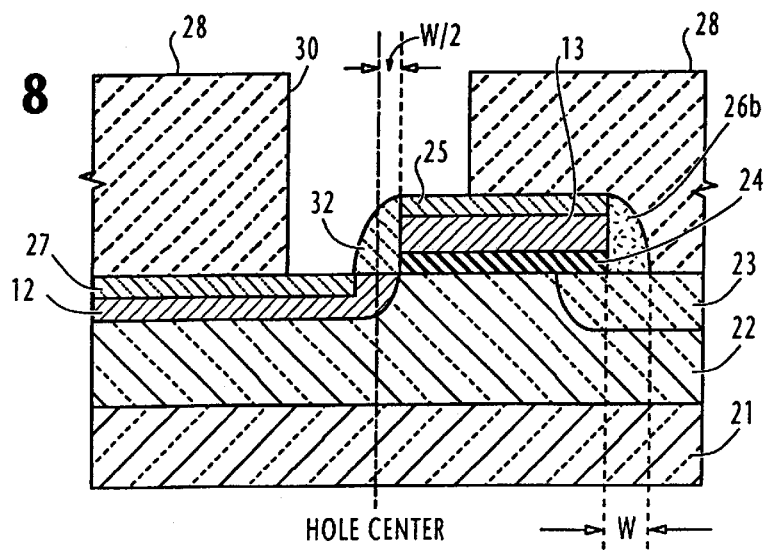
FIG. 8 is a cross-sectional view of a modified embodiment of this invention taken along the lines 6—6 of FIG. 5.

The leakage current problem can also be solved by an embodiment shown in FIG. 8. In this embodiment, use is made of an anti-etching material when the sidewall spacers 26a and 26b are formed before the shared contact hole 30 is created, so that the spacer 26a resists corrosion by the etching material and remains intact as shown at 32. Such an anti-etching material may be of a substance dissimilar to the interlayer film 28. If silicon dioxide is used for the interlayer film 28, silicon nitride can be used for the sidewall spacers 26a and 26b and the film 28 is etched by using a process in which the oxide-to-nitride selection ratio of 20 percent is employed.

What is claimed is:

1. A method for fabricating a semiconductor device, comprising the steps of:
    a) forming a first semiconductor body;
    b) forming a laminated structure of an insulating layer on said first semiconductor body and a conductive layer on said insulating layer;
    c) forming insulating spacers on sidewalls of said laminated structure, each of said spacers having a width W; and
    d) forming a diffusion layer in said first semiconductor body so that an edge of said diffusion layer is adjacent to one of said spacers;
    e) forming a second semiconductor body; and
    f) forming a shared contact hole in said second semiconductor body for establishing an ohmic contact between said diffusion layer and said conductive layer, a center axis of the shared contact hole being located a distance W/2 from an edge of said laminated structure—so that portions of said diffusion layer and said conductive layer which are exposed to the outside through said shared contact hole have substantially equal areas.

2. The method of claim 1, further comprising the step of removing one of said spacers which is located within said shared contact hole.

3. The method of claim 2, further comprising the step of doping an impurity of same conductivity type as conductivity type of said diffusion layer through said shared contact hole.

4. A method for fabricating a semiconductor device, comprising the steps of:
    a) forming a first semiconductor body;
    b) forming a laminated structure of an insulating layer on said first semiconductor body, a polysilicon layer on said insulating layer and a first silicide layer on the polysilicon layer;
    c) forming insulating spacers on sidewalls of said laminated structure;
    d) forming a diffusion layer in said first semiconductor body so that an edge of said diffusion layer is adjacent to one of said spacers;
    e) forming a second silicide layer in said diffusion layer so that an edge of the second silicide layer is adjacent to one of said spacers;
    f) forming a second semiconductor body; and
    g) forming a shared contact hole in said second semiconductor body for establishing an ohmic contact between said first and second silicide layers, a center axis of the shared contact hole being located at equal distances from the edges of said first and second silicide layers so that portions of said diffusion layer and said conductive layer which are exposed to the outside through said shared contact hole have substantially equal areas.

5. The method of claim 4, further comprising the step of removing one of said spacers which is located within said shared contact hole.

6. The method of claim 5, further comprising the step of doping an impurity of same conductivity type as conductivity type of said diffusion layer through said shared contact hole.

* * * * *